United States Patent
Volkovich et al.

(10) Patent No.: US 10,401,841 B2
(45) Date of Patent: Sep. 3, 2019

(54) IDENTIFYING REGISTRATION ERRORS OF DSA LINES

(71) Applicant: KLA-TENCOR CORPORATION, Milpitas, CA (US)

(72) Inventors: Roie Volkovich, Hadera (IL); Eran Amit, Haifa (IL); Raviv Yohanan, Qiryat Motzkin (IL)

(73) Assignee: KLA-Tencor Corporation, Milpitas, CA (US)

( * ) Notice: Subject to any disclaimer, the term of this patent is extended or adjusted under 35 U.S.C. 154(b) by 439 days.

(21) Appl. No.: 14/867,834

(22) Filed: Sep. 28, 2015

(65) Prior Publication Data

US 2016/0018819 A1    Jan. 21, 2016

Related U.S. Application Data

(63) Continuation of application No. PCT/US2014/046220, filed on Jul. 10, 2014.

(60) Provisional application No. 61/845,173, filed on Jul. 11, 2013.

(51) Int. Cl.
*G05B 19/418* (2006.01)
*G03F 7/00* (2006.01)
*G03F 7/20* (2006.01)

(52) U.S. Cl.
CPC ..... *G05B 19/41875* (2013.01); *G03F 7/0002* (2013.01); *G03F 7/70625* (2013.01); *G05B 2219/32368* (2013.01); *G05B 2219/37224* (2013.01)

(58) Field of Classification Search
CPC combination set(s) only.
See application file for complete search history.

(56) References Cited

U.S. PATENT DOCUMENTS

| 2004/0181768 | A1 | 9/2004 | Krukar |
| 2011/0299758 | A1 | 12/2011 | Shi et al. |
| 2012/0009511 | A1* | 1/2012 | Dmitriev ............ G03F 1/72 430/5 |
| 2012/0331428 | A1 | 12/2012 | Cheng et al. |
| 2014/0214354 | A1* | 7/2014 | Dreifus ............ G01R 31/2856 702/117 |

(Continued)

FOREIGN PATENT DOCUMENTS

KR    20090116033 A    11/2009

OTHER PUBLICATIONS

"Directed self-assembly of block copolymers for next generation nanolithography" Seong-Jun Jeong et al.; Materials Today, vol. 16, No. 12—Dec. 2013; Research: Review—1369-7021/06—2013, Elsevier Ltd.

*Primary Examiner* — Mamadou L Diallo
(74) *Attorney, Agent, or Firm* — Suiter Swantz pc llo

(57) ABSTRACT

Methods and respective modules are provided, configured to identify registration errors of DSA lines with respect to guiding lines in a produced structure, by comparing a measured signature of the structure with simulated signatures corresponding to simulated structures having varying simulated characteristics, and characterizing the produced structure according to the comparison. The characterization may be carried out using electromagnetic characterization of a geometric model or in a model-free manner by analyzing model-based results. Thus, for the first time, positioning and dimensional errors of DSA lines may be measured.

20 Claims, 5 Drawing Sheets

(56) References Cited

U.S. PATENT DOCUMENTS

2015/0346608 A1* 12/2015 Seidel .................... G01B 11/02
355/52
2016/0217233 A1* 7/2016 Kamon ............... G06F 17/5068

* cited by examiner

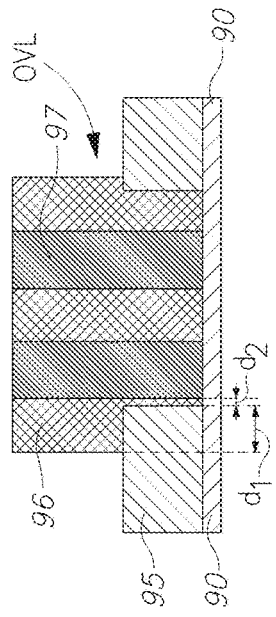
Figure 1A
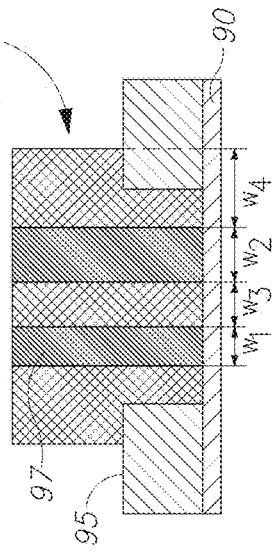
Figure 1B
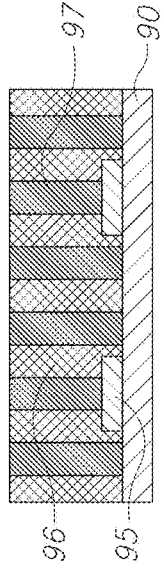
Figure 1C
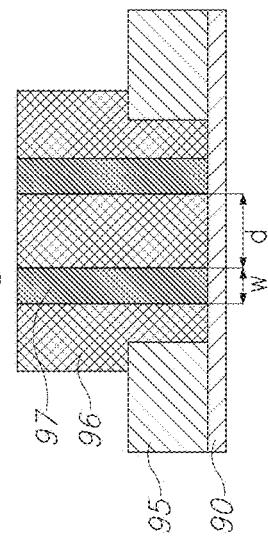
Figure 1D
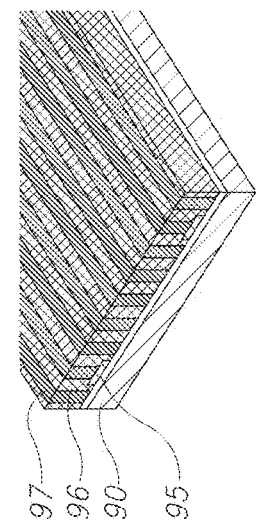
Figure 1E
Figure 1F

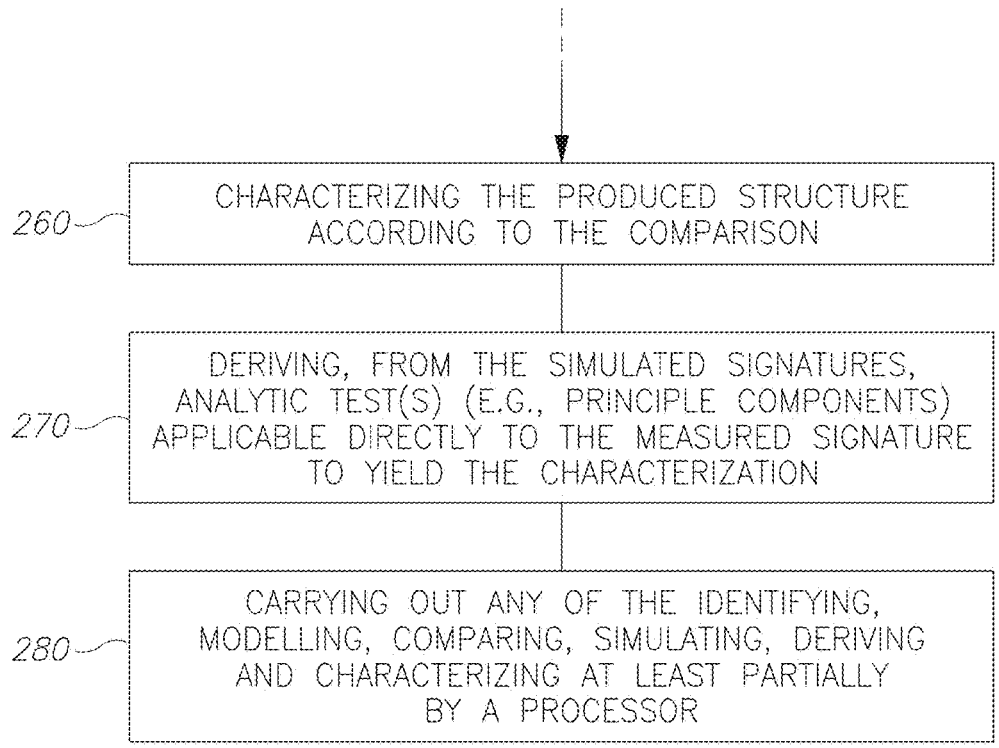
Figure 4 (cont. 1)

IDENTIFYING REGISTRATION ERRORS OF DSA LINES

CROSS REFERENCE TO RELATED APPLICATIONS

This application is filed under 35 U.S.C. § 120 and § 365(c) as a continuation of International Patent Application Serial No. PCT/US14/46220, filed on Jul. 10, 2014, which application claims the benefit under 35 U.S.C. 119(e) of U.S. Provisional Patent Application No. 61/845,173 filed on Jul. 11, 2013, which applications are incorporated herein by reference in their entirety.

FIELD OF THE INVENTION

The present invention relates to the field of directed self-assembly (DSA), and more particularly, to characterization of produced DSA structures.

BACKGROUND OF THE INVENTION

Metrology targets are designed to enable the measurement of parameters that indicate the quality of wafer production steps and quantify the correspondence between design and implementation of structures on the wafer. Metrology targets as specific structures optimize the requirements for device similarity and for optical measurability.

A directed self-assembly (DSA) process is used to create structures by directing a block co-polymerization process according to guiding lines which determine the spatial arrangement of the polymer blocks.

BRIEF SUMMARY OF THE INVENTION

One aspect of the present invention provides a method comprising identifying registration errors of DSA lines with respect to guiding lines on a produced structure, by comparing a measured signature of the structure with simulated signatures corresponding to a plurality of simulated structures having varying simulated characteristics, and characterizing the produced structure according to the comparison.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 1A is a high level schematic illustration of a possible configuration of the resulting DSA polymer lines with respect to guiding lines, according to an embodiment of the invention;

FIG. 1B is a high level schematic illustration of a possible configuration of the resulting DSA polymer lines with respect to guiding lines, according to an embodiment of the invention;

FIG. 1C is a high level schematic illustration of a possible configuration of the resulting DSA polymer lines with respect to guiding lines, according to an embodiment of the invention;

FIG. 1D is a high level schematic illustration of a possible configuration of the resulting DSA polymer lines with respect to guiding lines, according to an embodiment of the invention;

FIG. 1E is a high level schematic illustration of a possible configuration of the resulting DSA polymer lines with respect to guiding lines, according to an embodiment of the invention;

FIG. 1F is a high level schematic illustration of a possible configuration of the resulting DSA polymer lines with respect to guiding lines, according to an embodiment of the invention;

DETAILED DESCRIPTION OF THE INVENTION

Figure 2:
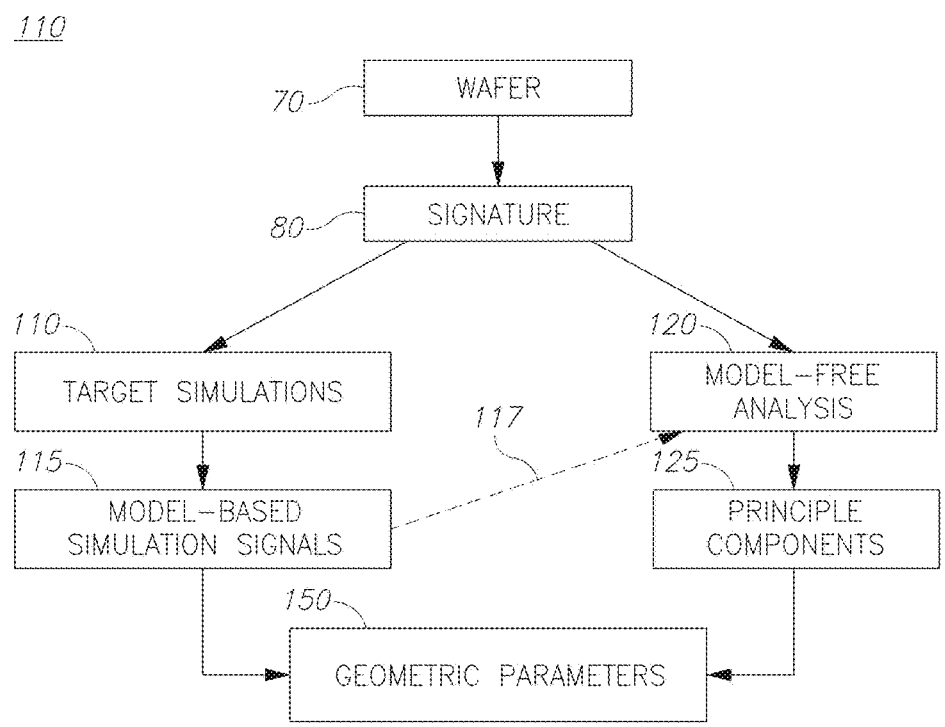
FIG. 2 is a high level schematic illustration of the operation of a DSA registration error identifier, according to some embodiments of the invention.
Figure 2:
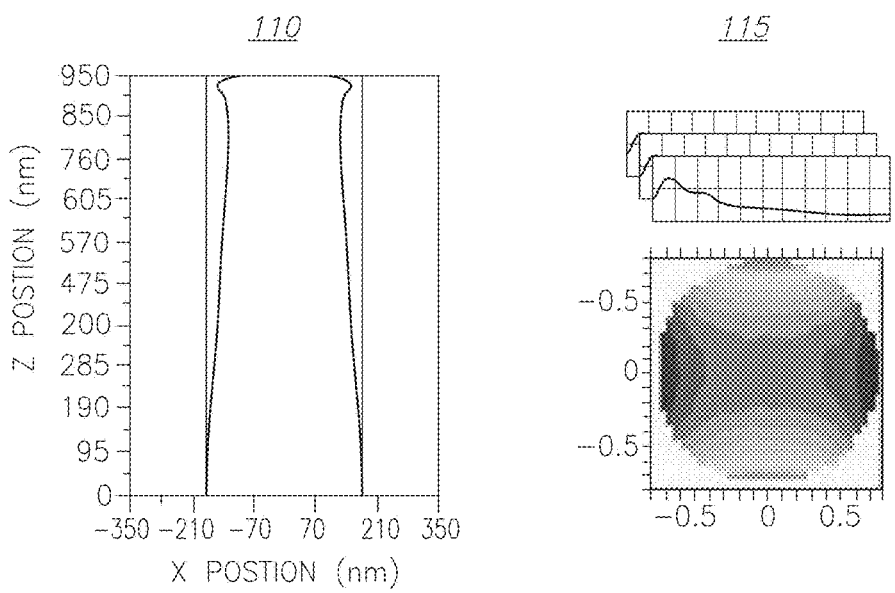

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings, making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Directed self-assembly (DSA) is a production process for creating fine structures which may serve as parts of device structures, of metrology targets or of any other permanent or temporary structure. The process involves block co-polymerization which is directed by preformed guiding lines which determine the spatial arrangement of the polymer blocks. In one non-limiting example, the co-polymerization involves alternating lines of polystyrene (PS) and polymethylmethacrylate (PMMA) molecules which are directed by PS guiding lines cross-linked to a surface. The guiding lines may be produced by lithography steps, involving e.g., resist deposition and patterning by etching, or any other procedure. As the guiding lines determine the resulting polymerization pattern, and as the system is very sensitive to the arrangement of the polymer structures that result from the polymerization, it is crucial to ensure correct DSA polymerization with respect to the guiding lines. The term "guiding line" as used herein in this application, is defined as a designed line in any type of layer, which serves to direct polymerization in a DSA process. It is noted that the term "guiding line" refers to any type of guiding structure, under implementation of any type of DSA process (e.g., graphoepitaxy, chemoepitaxy). Specifically, guiding lines may be device or target elements themselves and/or serve to produce polymer patterns which are used as target structures or as a basis for additional producing device or target structures by further processing.

While DSA of block copolymers has engendered considerable interest in the last few years as a novel extension to optical or electron beam lithography through its ability to multiply pattern density and reduce pitch size (the pitch being the periodicity of the structure), the requirement for customization of line-space patterns formed by DSA demands detailed knowledge of the placement accuracy of the DSA pattern features. Therefore the quantitative and precise knowledge of DSA-feature registration to the chemical pre-pattern is critical and important to diagnose and control. However, currently there is no automatic and efficient way to measure registration placement error between the block co-polymer and the guiding lines in DSA process.

The disclosed invention concerns a novel methodology for measuring registration error placement in Direct Self Assembly (DSA) processes, which is realized by measuring and tracking the registration placement error between the block co-polymer and the guiding lines in DSA-based processes in a quick and efficient way.

FIGS. 1A-1F are high level schematic illustrations of possible configurations of the resulting DSA polymer lines 96, 97 with respect to guiding lines 95, according to some embodiments of the invention. In the illustrated example, PS lines 96 are polymerized along PS guiding lines 95 and PMMA lines 97 polymerize between PS lines 96. These examples are non-limiting and similar principles may be applied to any DSA method and any guiding lines.

FIG. 1A schematically illustrates proper polymerization, in which the cross linking between guiding lines 95 and PS lines 96 is along half the width of PS lines 96 marked by d/2. The half of PS line 96 that reaches substrate 90 may be understood to represent, without being bound by theory, the length of one PS molecule cross-linked between the sides of guiding lines 95 on one side and PMMA molecules of PMMA line 97. Furthermore, FIG. 1A illustrates equal widths of each of PS and PMMA lines 96, 97, (both within each type—d and w, as well as between the types d=w) which in certain embodiments may be considered the preferred arrangement.

FIGS. 1B-1D schematically illustrate different cases of improper polymerization, including eccentric cross-linking of PS line 96 to guiding lines 95 (FIG. 1B, $d_1 \neq d_2$, overlay OVL error) unequal width of PS and PMMA lines 96, 97 (FIG. 1C, d≠w) and varying line widths (FIG. 1D, $w_1 \neq w_2$, $w_3 \neq w_4$, CD variation error). The schematic illustrations of DSA line configurations may refer to any types of DSA lines 96, 97 associated with any type of guiding line 95. Additional forms of asymmetric or irregular polymerization may be defined in similar ways, and the disclosed invention may be arranged to identify and characterize any type of asymmetric or irregular polymerization. Any kind of deviation from a predefined geometric arrangement of lines 96, 97 and their relation to guiding lines 95 may be termed a registration error and may be handled by the disclosed methods. Detectable registration errors may have a global nature, and encompass many lines 96, 97, 95, or may be local and concern one or few lines 96, 97, 95. FIGS. 1E, 1F schematically illustrate an example for DSA modeling in isometric and front views (respectively) that were generated using simulation software. Based on these geometric arrangements, various characteristics such as the diffraction spectra may be calculated and compared to measured parameters.

FIG. 2 is a high level schematic illustration of the operation of a DSA registration errors identifier, according to some embodiments of the invention. The identifier may measure signatures 80 (e.g., grating diffraction spectra) of wafer regions 70 produced by DSA and analyze signatures 80 to identify correct or incorrect geometric dimensions of lines 96, 97 and positioning of lines 96, 97 with respect to guiding lines 95 (e.g., identify patterns such as the ones illustrated in FIGS. 1A-1D).

The identifier may construct target simulations 110 and calculate respective simulated signals 115 (e.g., grating diffraction spectra), for example by using modelling methods such as rigorous coupled-wave analysis (RCWA) or other types of electromagnetic simulation engines. Target simulations 110 may vary with respect to different parameters such as overlays of DSA lines 96 with respect to guiding lines 95, critical dimension (CD) variation of any DSA line type 96, 97, side wall angles of lines 96, 97 etc. Target simulations 110 and simulated signals 115 are illustratively depicted at the bottom of FIG. 2 by two nonlimiting schematic drawings, target simulation 110 exemplified by a profile model and simulated signals 115 exemplified by simulated diffraction response.

Comparison of signatures 80 with model-based simulated signals 115 may be used to derive geometric parameters 150 of measured wafer structures 70, e.g., using classification algorithms.

In certain embodiments, target simulations 110 and respective simulated signals 115 may be used to carry out (117) an analysis of the dependency of simulated signals 115 on target characteristics 110, which may enable a model-free analysis 120 of signatures 80, for example by identifying principle components 125 of signatures 80 which can be translated or converted into geometric parameters 150. Such an approach may accelerate the alignment measurements and allow on-the-fly application of method 200 or parts thereof.

Figure 3:
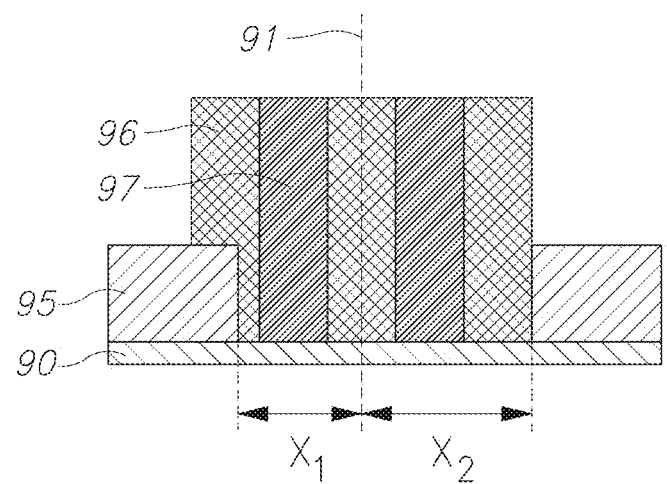
FIG. 3 is a high level schematic illustration of improper positioning of DSA polymer lines with respect to guiding lines, according to some embodiments of the invention; and, FIG. 4 is a high level flowchart illustrating a method, according to some embodiments of the invention.

FIG. 3 is a high level schematic illustration of improper positioning of DSA polymer lines 96, 97 with respect to guiding lines 95, according to some embodiments of the invention. The disclosed invention may comprise comparing the position of a center of symmetry 91 of the pattern of DSA lines 96, 97 to the positions of guiding lines 95 and calculate respective distances $x_1$, $x_2$ between DSA center of symmetry 91 and guiding lines 95. The distance may be taken as an overlay indicator between lines 96 and guiding lines 95.

In certain embodiments, varying CD of lines 96, 97 may be measured by tracking the 3σ CD variation of each co-polymer CD grating 96, 97.

In certain embodiments, the registration placement error method can be extended to using multiple targets. Combinations of targets in many cases have more diverse encoded focus information than a single target and thus may be used to resolve the registration error better using model-based (shape discovery) or model-less methods. In angular resolved scatterometry, if the optical system is ideal, zero placement error results in zero diffraction order signals, which are the interference between the zero diffraction order and both plus and minus one diffraction orders of the gratings (or other periodic structures). In case of a placement error, the zero diffraction order is the same as in the case when there is no placement error but the plus and minus one diffraction orders are not equal, which results in a different interference image. By using different model-based methods or model-less methods it is possible to compare the correct structure, which creates the resulted interference image.

Figure 4:
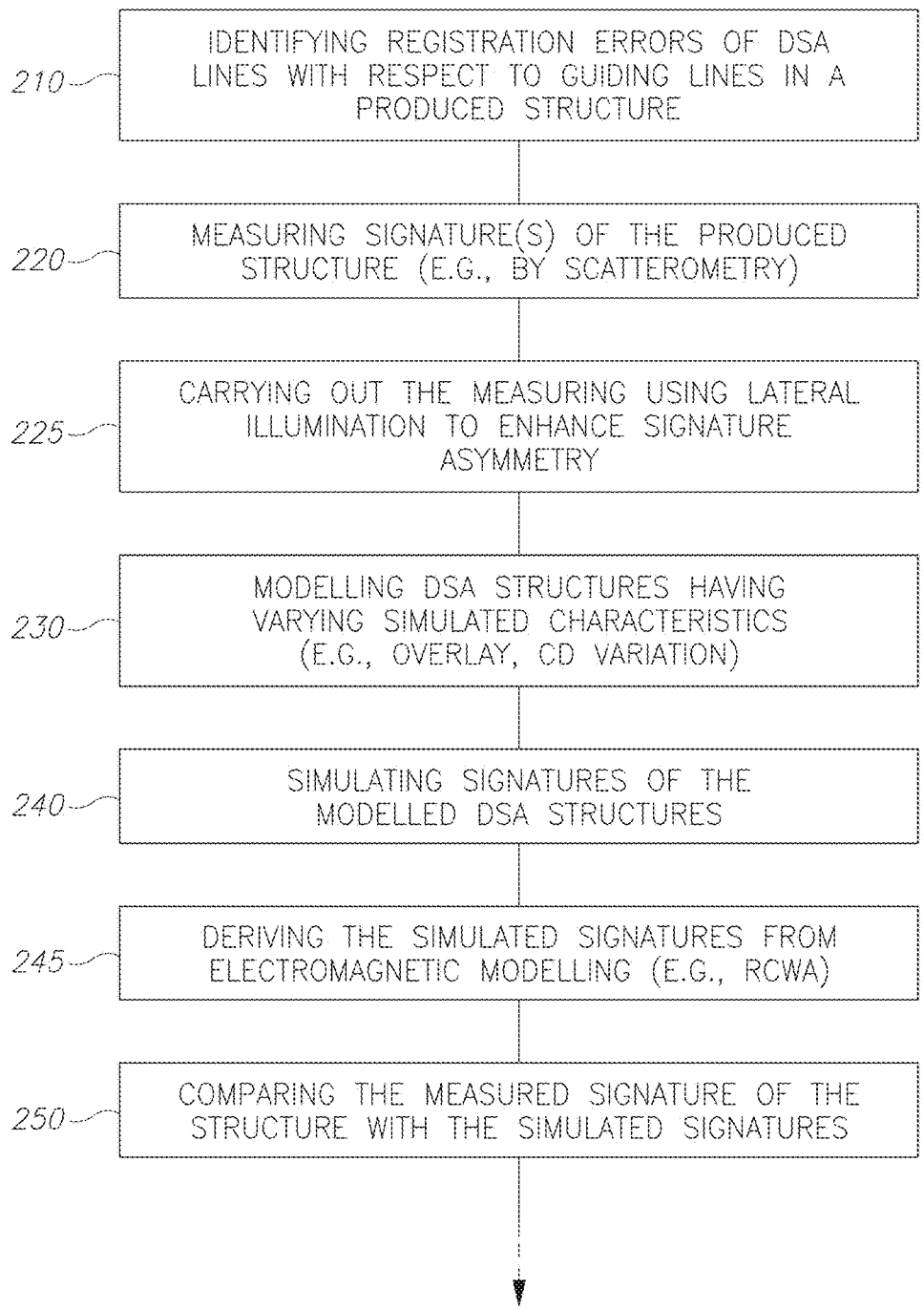

FIG. 4 is a high level flowchart illustrating a method 200, according to some embodiments of the invention. Method 200 may be at least partially implemented by at least one processor, and stages of method 200 may be implemented in respective computer program products comprising a computer readable storage medium having computer readable program embodied therewith and configured to carry out respective stages or parts thereof.

Method 200 may comprise identifying registration errors of DSA lines with respect to guiding lines in a produced structure (stage 210), by comparing a measured signature of the structure with simulated signatures corresponding to a plurality of simulated structures having varying simulated characteristics (stage 250), and characterizing the produced structure according to the comparison (stage 260). Method 200 may further comprise measuring signature(s) of the produced structure (e.g., by scatterometry) (stage 220), modelling DSA structures having varying simulated characteristics (e.g., overlay, CD variation) (stage 230) and simulating signatures of the modelled DSA structures (stage 240). At least one of identifying 210, modelling 230, simulating 240, comparing 250 and characterizing 260 may be carried out by at least one processor (stage 280). The simulated signatures may be derived from electromagnetic modelling such as rigorous coupled-wave analysis (RCWA) or other types of electromagnetic simulation engines (stage 245).

In certain embodiments, method 200 may further comprise carrying out the measurement using lateral illumination to enhance signature asymmetry such as non-symmetric high diffraction orders signature elements (stage 225).

In certain embodiments, method 200 may further comprise deriving, from the simulated signatures, at least one analytic test (such as principle components analysis (PCA) of the signatures) applicable directly to the measured signature to yield the characterization (stage 270).

Non-limiting examples for the simulated characteristics comprise overlay between at least one type of the DSA lines and the guiding lines; and critical dimension (CD) variation of at least one type of the DSA lines.

Advantageously, the disclosed methods and modules allow, for the first time, measuring registration placement error in DSA process using model-based or model-free grating scatterometry simulations of single or multiple DSA targets.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
identifying one or more registration errors of directed self-assembly (DSA) lines with respect to guiding lines in a structure comprising:
acquiring, with a scatterometry optical system, a measurement signature from the structure;
comparing, with one or more processors, the measured signature of the structure with one or more simulated signatures of a plurality of simulated structures having varying simulated characteristics; and
characterizing, with the one or more processors, the structure according to the comparison; and
controlling a registration of the DSA lines with respect to the one or more guiding lines in the structure based on the identification of the one or more registration errors.

2. The method of claim 1, wherein the one or more simulated signatures are derived from electromagnetic modelling.

3. The method of claim 2, wherein the electromagnetic modelling comprises rigorous coupled-wave analysis.

4. The method of claim 1, further comprising:
deriving, from the one or more simulated signatures, at least one analytic test applied to the measured signature.

5. The method of claim 4, wherein the at least one analytic test comprises principle components of the one or more simulated signatures.

6. The method of claim 1, the acquiring, with a scatterometry optical system, a measurement signature from the structure comprises:
acquiring, with a scatterometry optical system, a measurement signature from the structure using lateral illumination to enhance a non-symmetric high diffraction orders signature.

7. The method of claim 1, wherein the simulated characteristics comprise an overlay between at least one type of the DSA lines and the guiding lines.

8. The method of claim 1, wherein the simulated characteristics comprise a critical dimension variation of at least one type of the DSA lines.

9. The method of claim 1, wherein the structure comprises a plurality of targets.

10. A computer program product comprising:
a non-transitory computer-readable storage medium having computer readable program embodied therewith, the computer readable program configured to cause one or more processors to:
identify registration errors of DSA lines with respect to guiding lines in a structure by:
directing a scatterometry tool to acquire a measurement signature from the structure;
comparing the measured signature of the structure with one or more simulated signatures of a plurality of simulated structures having varying simulated characteristics; and
characterizing the structure according to the comparison; and
control a registration of the DSA lines with respect to the one or more guiding lines in the structure based on the identification of the one or more registration errors.

11. The computer program product of claim 10, wherein the one or more simulated signatures are derived from electromagnetic modelling.

12. The computer program product of claim 11, wherein the electromagnetic modelling comprises rigorous coupled-wave analysis.

13. The computer program product of claim 10, wherein the directing a scatterometry tool to acquire a measurement signature from the structure comprises:
directing a scatterometry tool to acquire a measurement signature from the structure using lateral illumination to enhance a non-symmetric high diffraction orders signature.

14. The computer program product of claim 10, wherein the simulated characteristics comprise an overlay between at least one type of the DSA lines and the guiding lines.

15. The computer program product of claim 10, wherein the simulated characteristics comprise a critical dimension variation of at least one type of the DSA lines.

16. An apparatus comprising:
a scatterometry tool configured to acquire a measurement signature from a structure;
one or more processors configured to receive the measurement signature from the scatterometry tool, wherein the one or more processor are configured to execute a set of computer-readable program instructions for causing the one or more processors to:
identify registration errors of directed self-assembly (DSA) lines with respect to one or more guiding lines in the structure by:
comparing the measured signature of the structure with one or more simulated signatures of a plurality of simulated structures having varying simulated characteristics; and
characterizing the structure according to the comparison; and
control a registration of the DSA lines with respect to the one or more guiding lines in the structure based on the identification of the one or more registration errors.

17. The apparatus of claim 16, wherein the one or more simulated signatures are derived from electromagnetic modelling.

18. The apparatus of claim 17, wherein the electromagnetic modelling comprises rigorous coupled-wave analysis.

19. The apparatus of claim 16, wherein the scatterometry tool is configured to acquire the measurement signature from the structure using lateral illumination to enhance a non-symmetric high diffraction orders signature.

20. The apparatus of claim 16, wherein the simulated characteristics comprise at least one of an overlay between at least one type of the DSA lines and the guiding lines or a critical dimension variation of at least one type of the DSA lines.

* * * * *